United States Patent
Nguyen et al.

(10) Patent No.: US 8,589,101 B1
(45) Date of Patent: Nov. 19, 2013

(54) METHOD AND APPARATUS FOR MEASURING RMS VALUES OF BURST-FIRED CURRENTS

(71) Applicant: Neilsen-Kuljian, Inc., San Jose, CA (US)

(72) Inventors: Huy D. Nguyen, Tracy, CA (US); Tom Lik-Chung Lee, San Jose, CA (US)

(73) Assignee: Neilsen-Kuljian, Inc., San Jose, CA (US)

( * ) Notice: Subject to any disclaimer, the term of this patent is extended or adjusted under 35 U.S.C. 154(b) by 0 days.

(21) Appl. No.: 13/784,702

(22) Filed: Mar. 4, 2013

(51) Int. Cl.
*G01M 19/00* (2006.01)

(52) U.S. Cl.
USPC ........ 702/64; 327/419; 318/801; 318/400.04; 324/522; 324/177; 324/679; 73/168

(58) Field of Classification Search
USPC .......... 702/64; 327/419; 318/801, 723, 400.1, 318/400.11, 400.37; 324/522, 177, 679, 324/419; 73/168, 862.191, 862.321, 73/862.541
See application file for complete search history.

(56) References Cited

U.S. PATENT DOCUMENTS

| | | | | |
|---|---|---|---|---|
| 5,345,156 A * | 9/1994 | Moreira | .................... | 318/400.04 |
| 5,422,570 A * | 6/1995 | Moreira | ........................ | 324/177 |
| 5,473,240 A * | 12/1995 | Moreira | ........................ | 318/801 |
| 5,481,166 A * | 1/1996 | Moreira | .................... | 318/400.04 |
| 5,671,635 A * | 9/1997 | Nadeau et al. | .................... | 73/168 |
| 5,906,432 A * | 5/1999 | Wade et al. | ..................... | 366/97 |
| 6,617,858 B1 * | 9/2003 | Baumgaertl et al. | .......... | 324/522 |
| 7,162,653 B2 * | 1/2007 | Mares et al. | .................. | 713/310 |
| 7,262,854 B2 * | 8/2007 | Imura | .......................... | 356/402 |
| 2011/0109162 A1 * | 5/2011 | Rizet et al. | ..................... | 307/66 |
| 2012/0062249 A1 * | 3/2012 | Shamir | ........................ | 324/679 |
| 2012/0092060 A1 * | 4/2012 | Ganesan | ....................... | 327/419 |

FOREIGN PATENT DOCUMENTS

JP 05064435 A * 3/1993
JP 2011164997 A * 8/2011

* cited by examiner

*Primary Examiner* — Carol S Tsai
(74) *Attorney, Agent, or Firm* — TIPS Group

(57) ABSTRACT

An apparatus for measuring RMS values of burst-fired currents includes a current sensor having a signal output, an analog-to-digital (A/D) converter coupled to the signal output of the current sensor, a digital processor coupled to an output of the A/D converter, and a digital memory coupled to the digital processor. Code segments stored in the digital memory are executable on the digital processor and implement a process of: a) initially sampling the output of the A/D converter; b) determining from the initial sampling a burst-fired current pattern; c) sampling the output of the A/D converter N times within a burst-fired current pattern to provide N samples; and d) calculating an RMS value from the N samples.

19 Claims, 11 Drawing Sheets

METHOD AND APPARATUS FOR MEASURING RMS VALUES OF BURST-FIRED CURRENTS

BACKGROUND

Electric heating elements are used for a number of industrial equipment applications including ovens, furnaces, heat sealers, etc. For some industrial processes it is important to be able to accurately control the chamber temperature of the equipment, which can be accomplished by precisely controlling the electric power applied to the heating elements. For example, SCR power controllers are commonly used for such a purpose.

A SCR power controller uses a silicon controlled rectifier (SCR) or "thyristor" to turn on and off the power applied to the heating elements(s). A SCR is a semiconductor device with at least four layers of alternating N-type and P-type materials which acts as a bistable switch. An SCR conducts when it is forward biased and does not conduct when it is reverse biased.

A zero-crossing switched (zero-switched or burst-fired) SCR power controller works by triggering at the moment when the value of an alternating current (AC) sine wave is at the baseline or "zero" voltage point. The power can be controlled by controlling the number of cycles "ON" to the number of cycles "OFF." The output will vary from a few cycles ON and a large number of cycles OFF at low input, through half the cycles ON and half OFF at half input, to all cycles ON at maximum input.

FIG. 1 illustrates a first example of a burst-fired current 10. In this example, there is a single AC cycle in a period when the current is ON and then a subsequent period when the current is OFF. The ON and OFF periods, in this example, define a burst-fired current cycle ("CYCLE"), and one or more burst-fired current cycles can create a pattern. The power output is equal to $P_{MAX}*ON/CYCLE$, where $P_{MAX}$ is the maximum power that can be provided to the heating element. The ratio "ON/CYCLE", which ranges from zero to one, is often referred as the "duty cycle."

FIG. 2 illustrates another example of a burst-fired current 12. Unlike the example of FIG. 1, in this example the ON period includes multiple AC cycles. Also, in this example, the burst-fired current cycle (comprising the ON period and the OFF period) and burst-fired current pattern are indicated to be the same, although in other embodiments the burst-fired current pattern may be more than one burst-fired current cycle. Again, the power output is proportional to the ratio $P_{MAX}*ON/CYCLE$, where $P_{MAX}$ is the maximum power that can be provided to the heating element.

FIG. 3 illustrates an industrial control apparatus 14 including an SCR power controller 16 and a heating element 18. Typically, a power source 20, such as a single-phase line power source in the range of 100-240 AC volts is used. The SCR power controller 16 coverts the AC current provided by power source 20 (typically 60 Hz in the U.S.) into a burst-fired current 22 to control the power applied to the heating element 18 and, therefore, the chamber temperature of the equipment with which it is associated. The SCR power controller can be controlled manually or by a feedback loop (e.g. from a control mechanism using a temperature sensor).

Problems can be encountered with certain forms of feedback. For example, temperature sensors can have time-lag delay and can degrade and/or fail over time preventing the desired precise temperature control of industrial equipment. A more direct way of measuring the power consumed by the heating element is desirable.

For the purposes of determining power consumption, a heating element of an industrial oven or the like can be modeled as a simple resistor because the reactive components of the power usage are relatively small. If the AC current is continuous, this model allows a calculation of the average power dissipated by the heating element as $P_{avg}=(V_{RMS})^2/R$, where $V_{RMS}$ is the root-mean-square (RMS) of the voltage and R is the resistance of the heating element. However, this will not give a true RMS value for burst-fired currents.

For industrial process control instruments, analog 4-20 and 10-50 mA current loops are often used. For example, with a 4-20 mA current loop, 4 mA represents the lowest end of the range and 20 mA is the highest end of the range. A key advantage of a current loop is that the accuracy of the signal is not affected by voltage drops in the interconnecting wiring and that the loop can provide operating current to the device.

SUMMARY

In an embodiment, set forth by way of example and not limitation, an apparatus for measuring RMS values of burst-fired currents includes a current sensor having a signal output, an analog-to-digital (A/D) converter coupled to the signal output of the current sensor, a digital processor coupled to an output of the A/D converter, and a digital memory coupled to the digital processor including code segments executable on the digital processor. In this example embodiment, the code segments implement the process of: a) initially sampling the output of the A/D converter; b) determining from the initial sampling a burst-fired current pattern; c) sampling the output of the A/D converter N times within a burst-fired current pattern to provide N samples, wherein the burst-fired current pattern includes at least one alternating current (AC) current-on period and at least one AC current-off period; and d) calculating an RMS value from the N samples.

In an embodiment, set forth by way of example and not limitation, a method for measuring RMS values of burst-fired currents includes: a) initially sampling a burst-fired current signal; b) determining from the initial sampling a burst-fired current pattern; c) sampling the burst-fired current signals N times within a burst-fired current pattern to provide N samples, wherein the burst-fired current pattern includes an alternating current (AC) current-on period and an AC current-off period; and d) calculating an RMS value from the N samples.

An advantage for certain example embodiments is that true RMS values can be obtained for burst-fired currents developed by SCR power controllers. These RMS values can be used by feedback mechanisms to accurately control the power output of SCR power controllers and, therefore, precisely control the heat generated by heating elements of industrial equipment.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
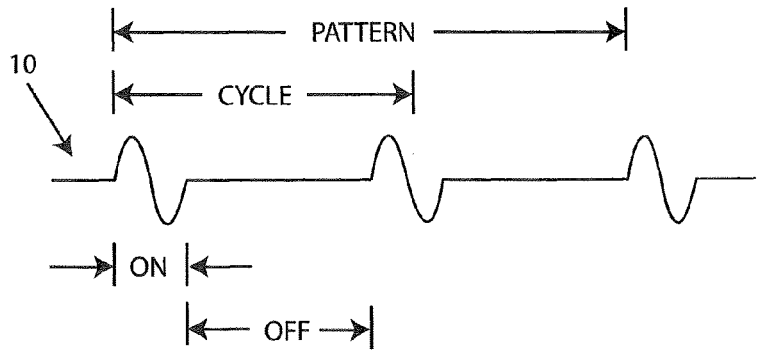
FIG. 1 is a graph of a first example of burst-fired current.
Figure 2:
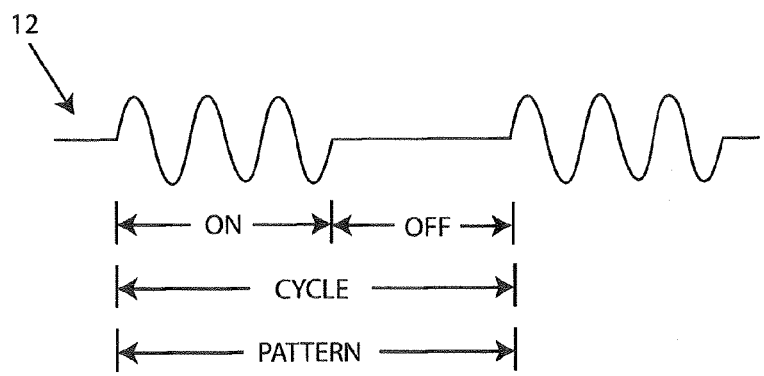
FIG. 2 is a graph of a second example of burst-fired current.
Figure 3:
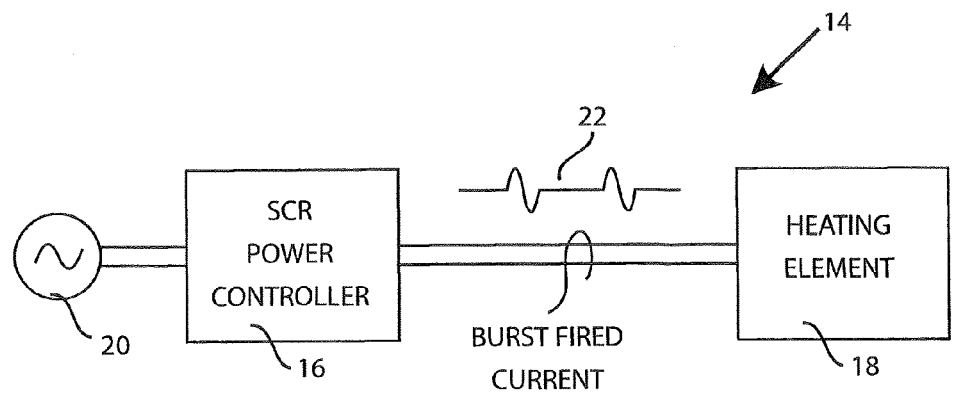
FIG. 3 is a block diagram illustrating a conventional SCR power controller for a heating element.
Figure 4:
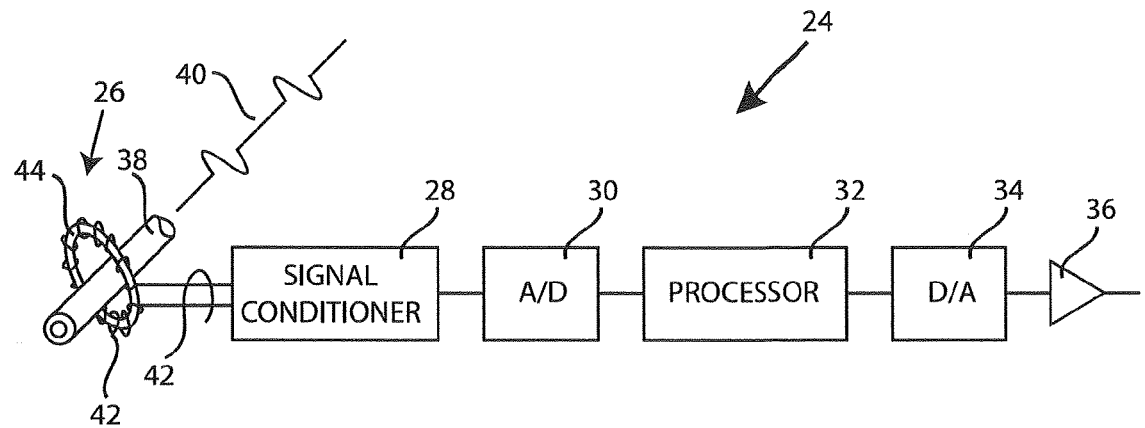
FIG. 4 is a block diagram of an example apparatus for measuring RMS values of burst-fired currents.

FIGS. 1-3 were described with respect to the prior art. FIG. 4 is a block diagram illustrating, by way of example and not limitation, an apparatus 24 for measuring RMS values of burst-fired currents that includes a current sensor 26, a signal conditioner 28, an analog-to-digital (A/D) converter 30, a processor 32, a digital-to-analog (D/A) converter 34 and an amplifier 36. A power wire 38 carrying a burst-fired current 40 is shown passing through the current sensor 26.

The current sensor 26 can, by way of non-limiting example, include an induction coil comprising a wire 42 wrapped around a core 44. Inductive current sensor apparatus are well known to those of skill in the art. For example, in U.S. Pat. No. 6,566,855 of Nguyen et al., the disclosure of which is incorporated herein by reference, a device to measure current magnitude in a conductor coupled to an electrical device is disclosed. It will be appreciated by those of skill in the art that an inductive sensor is just one type of current sensor and that other types of sensors, such as Hall-Effect sensors, can also be used to measure current.

In this example, a burst-fired current signal that is representative of the burst-fired current 40 is induced upon the induction coil comprising wire 42 and core 44. This burst-fired current signal at the output of the current sensor 26 is coupled to a signal conditioner 28 which conditions and amplifies the burst-fired current signal. An analog output of the signal conditioner 28 is then converted into a digital form by an analog-to-digital (A/D) converter 30. A processor 32 processes the digital output of A/D converter 30 and provides a digital output representative of the RMS value of the burst-fired current 40 that is converted into analog form by a digital-to-analog converter 34. The analog output of D/A converter 34 is then amplified by amplifier 36 to provide an analog output signal representative of the RMS value of the burst-fired current 40. A controller (not shown) can use this RMS value to determine the true RMS power that is being provided through the wire 38 to, for example a heating element.

In this example embodiment, it is preferred that the output of amplifier 36 conforms to an analog loop standard, such as an analog 4-20 or 10-50 mA current loop standard. Alternatively, the output of amplifier 36 can conform to other communication protocols, including wireless and digital protocols. Also, the D/A converter and/or amplifier 36 may be omitted in certain example embodiments. For example, the digital output of the processor 32 may be communicated to, for example, a controller either digitally or in analog form by a number of different protocols.

Figure 5:
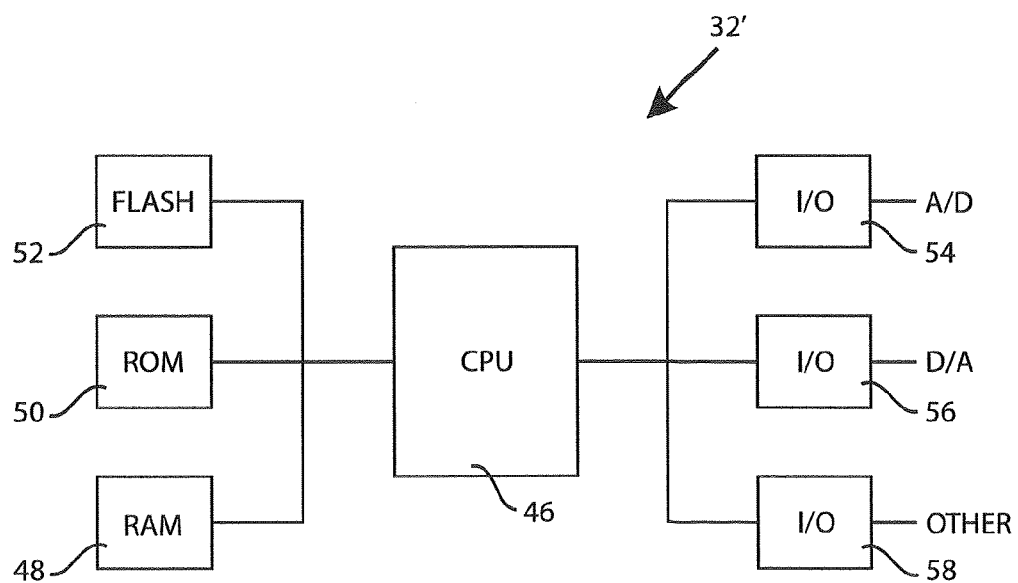
FIG. 5 is a block diagram of an example processor of FIG. 4.

FIG. 5 is a block diagram of an example processor 32' including a central processing unit (CPU) 46, random access memory (RAM) 48, read-only memory (ROM) 50, flash memory 52, an I/O 54 coupled to A/D converter 30 (see, FIG. 4), an I/O 56 coupled to D/A converter 56 (see, FIG. 4), and other I/O 58. The types and number of memory and I/O circuits are set forth by way of example and not limitation, as will be appreciated by those of ordinary skill in the art.

Processor 32' of FIG. 5 is illustrated, by way of example and not limitation, as a type of microprocessor or microcontroller that is available from a number of sources. For example, an 8-pin flash microcontroller from Microchip Technology, Inc., part number PIC12(L)F1840 has been found to be suitable. As will be appreciated by those of skill in the art, however, other forms of processor 32 are also suitable for certain applications. For example, the functionality of processor 32 may be implemented as a state machine, in discrete logic, or otherwise.

In the example of FIG. 5, the processor 32' includes digital memory (e.g. memories 48, 50, 52) that includes code segments (sometimes referred to as machine code) that are executable on the CPU 46. These code segments provide for a number of housekeeping and other functions including the measurement of RMS values of burst-fired current. These functions include: a) initially sampling the output of the A/D converter 30; b) determining from the initial sampling a burst-fired current pattern; c) sampling the output of the A/D converter 30 N times beginning at a start of a burst-fired current pattern to provide N samples, wherein the burst-fired current pattern includes at least one AC current-on period and at least one AC current-off period; and d) calculating an RMS value from the N samples.

It will be appreciated by those of skill in the art that there are a number of methods available to implement the functions set forth above. The following detailed examples are therefore not to be considered limitations on the methodologies available for implementing the method and apparatus of the various embodiments described herein.

Example 1

Figure 6:
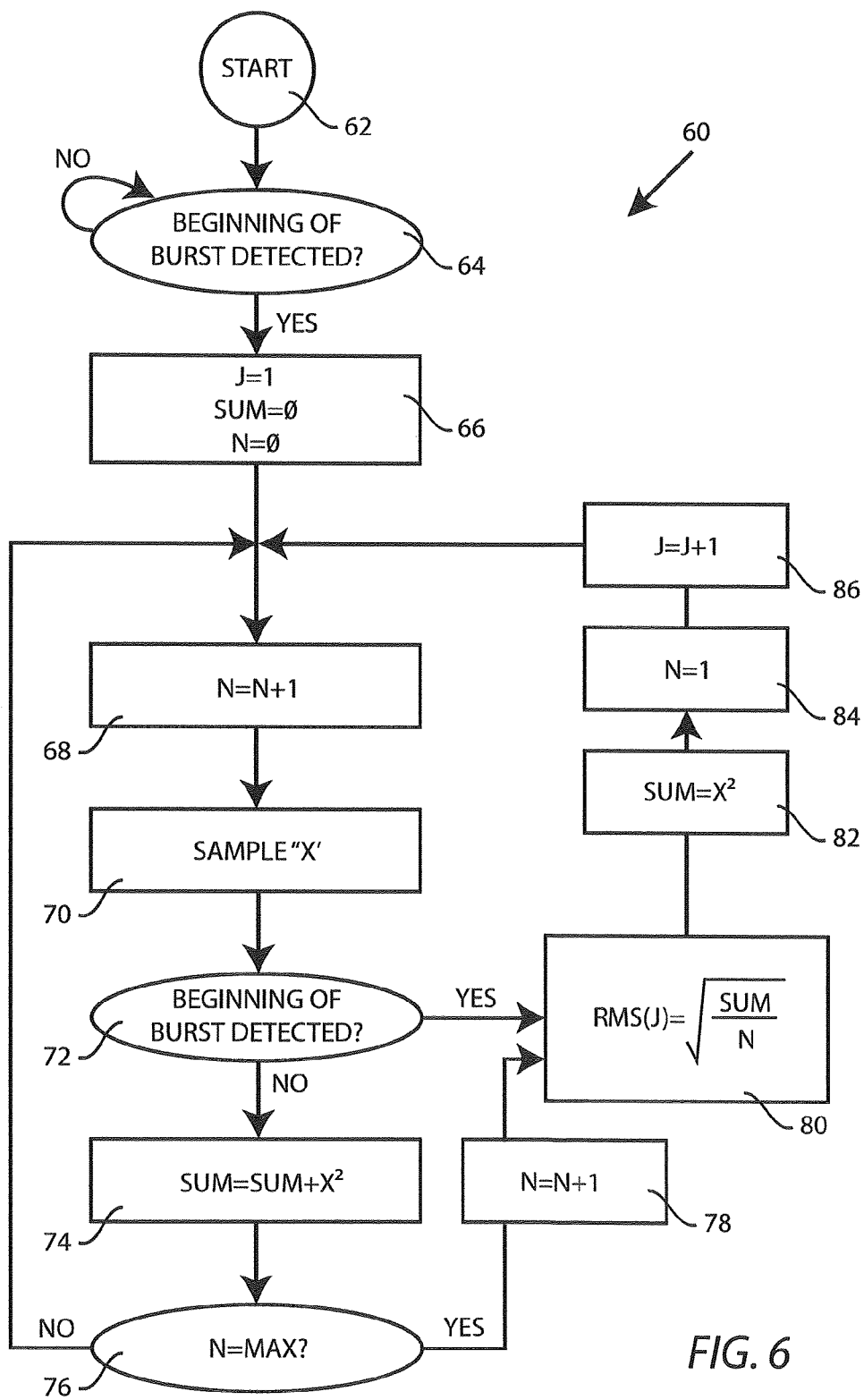
FIG. 6 is a flow diagram of a first example method for measuring RMS values of burst-fired currents.

FIG. 6 illustrates, by way of example and not limitation, a method 60 for measuring RMS values of burst-fired currents. This method can be implemented by the aforementioned code segments stored in digital memory coupled to the processor 46 of FIG. 5. Alternatively, the method can be implemented in other manners, e.g. by a state machine or by discrete logic.

The example method 60 begins at 62 and, in an operation 64, it is determined if the beginning of a burst-fired current cycle is detected. If so, an operation 66 initializes variables J, SUM and N. Next, in an operation 68, the variable N is incremented in an operation 68 and a sample "X" is taken in an operation 70. Next, in an operation 72, it is determined if the beginning of a burst-fired current cycle is detected and, if not, the value of SUM is increased by the square of the sample X, e.g. SUM=SUM+$X^2$. Then, in a decision operation it is determined if the number N of samples that have been taken have exceeded a maximum MAX to detect a "timeout" condition. If not, operational control loops back to operation 68 and another sample is taken. If operation 76 determines that there is a timeout (e.g. N=MAX), then N is incremented by operation 78 and operational 80 calculates the $J^{th}$ RMS value:

$$RMS(J)=SQRT(SUM/N)$$

Operation 80 is also triggered if a beginning of a burst is detected by operation 72. Thereafter, the variable SUM is set to X2, the variable N is initialized to 1, and the variable J is incremented by 1 before control is returned to operation 68.

Figure 7:
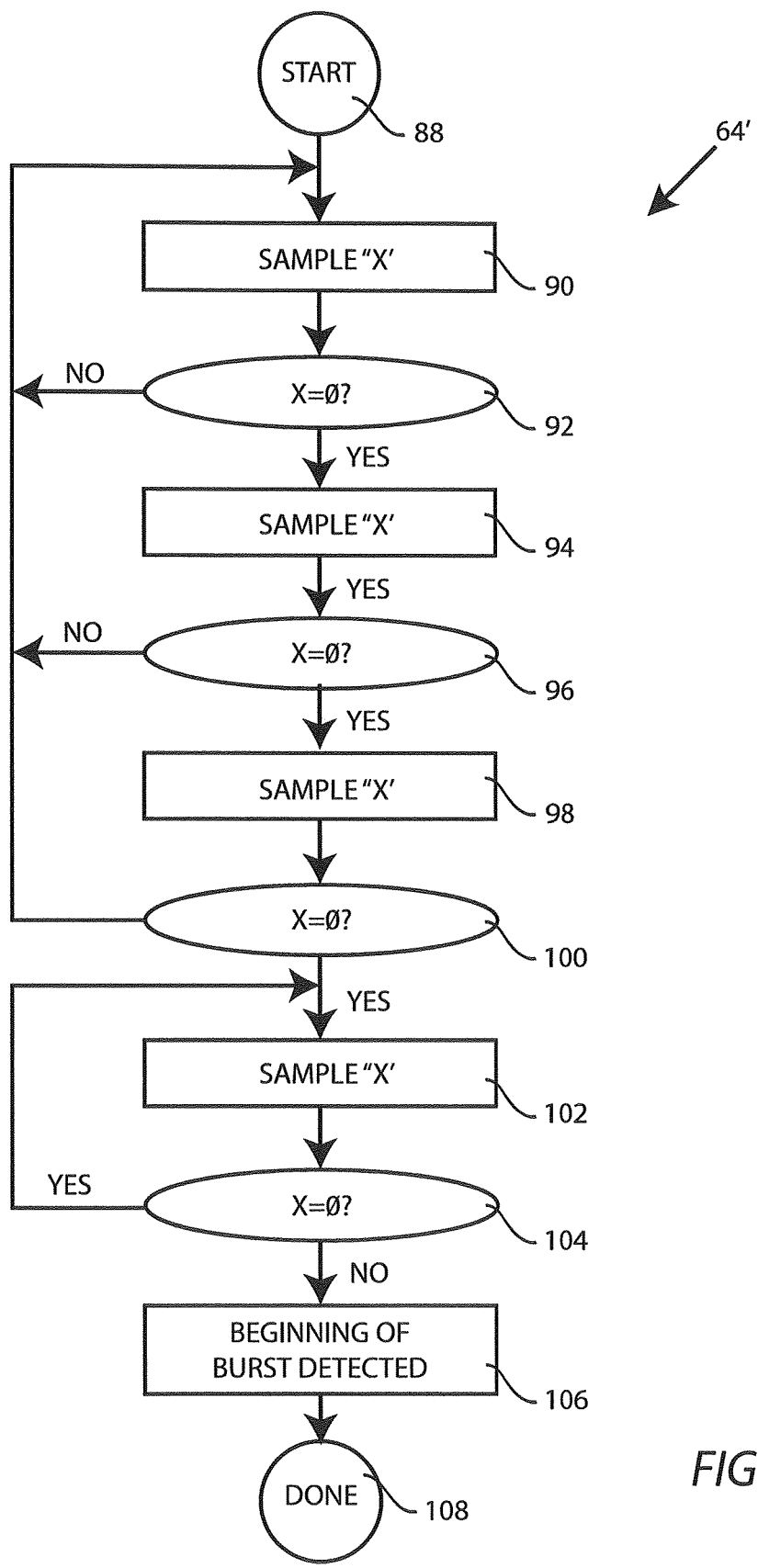
FIG. 7 is a flow diagram of a first example method for detecting a beginning of a burst.

FIG. 7 is an illustration, set forth by way of example and not limitation, of operation 64' of FIG. 6. Example operation 64' begins at 88 and, in an operation 90, a sample "X" is taken. If X=0 then a second sample "X" is taken in operation 94. Operation 96 then determines if the second sample X=0 and, if so, a third sample "X' is taken in operation 98. If an operation 100 determines that the third sample X=0, then it can be concluded that the burst-fired current cycle is in a current-off period (e.g. three successive samples indicate zero current). If any of the decision operations 92, 96 or 100 determine the sample "X" is not equal to zero, the process returns to operation 90.

Once it is determined that the burst-fired current cycle being sampled is in a current-off period, an operation 102 obtains another sample "X." Decision operation 104 then determines if this new sample "X" is equal to zero and, if so, loops back to operation 102 to take a new sample "X." The loop of operations 102 and 104 continues until sample X is not equal to zero, at which time it is determined in an operation 106 that the beginning of a new burst-fired current cycle has been detected. The process 64' is then considered to be completed at 108.

Figure 8:
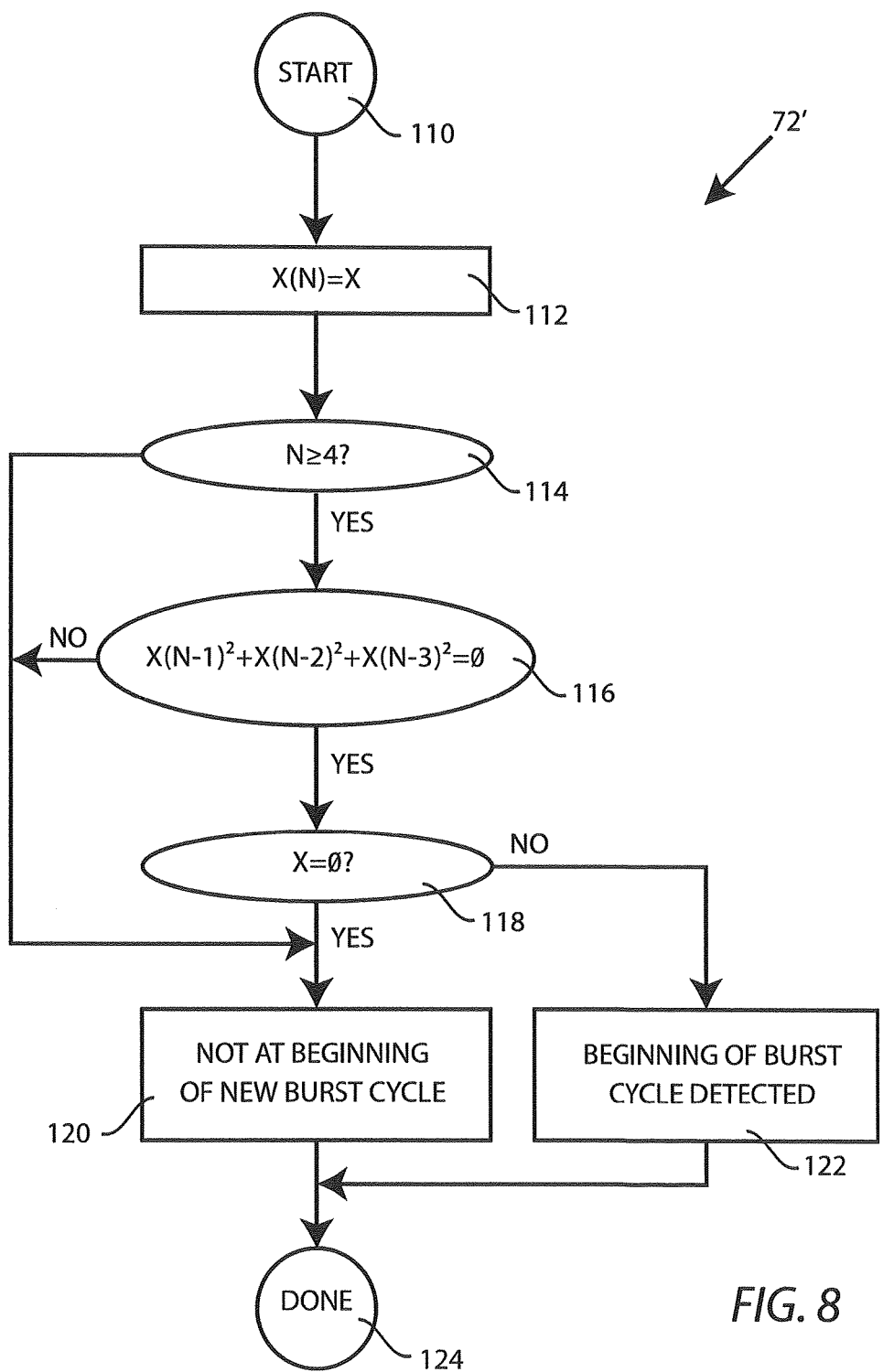
FIG. 8 is a flow diagram of a second example method for detecting a beginning of a burst.

FIG. 8 is an illustration, set forth by way of example and not limitation, of an operation 72' of FIG. 6. Example operation 72' begins at 110 and then, in an operation 112, it sample (X) is stored in an array X(N). Next, in an operation 114, it is determined whether N≥4. If so, stored samples X(N-1), X(N-2) and X(N-3) are each squared, summed and compared to zero in an operation 116. If they are equal to zero, it can be assumed that the burst-fired current cycle is in a current-off period. If operation 118 then determines that the current sample X is zero, it can be concluded in an operation 120 that the beginning of a new burst-fired current cycle is not detected. However, if operation 118 determines that the current sample X is not equal to zero, after three previous zero samples, it can be concluded in an operation 122 that the beginning of a new burst-fired current cycle has been detected. The process of operation 71' is then concluded at 124.

Figure 9:
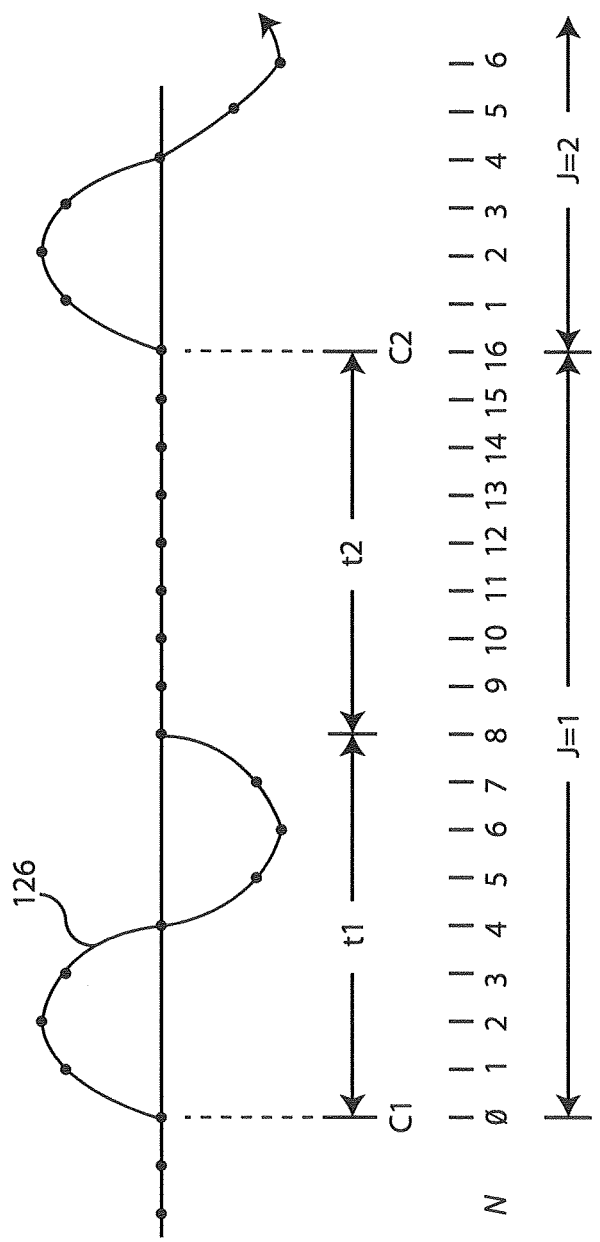
FIG. 9 is a graph of a third example burst-fired current.

FIG. 9 helps illustrate the example processes of FIGS. 6-8. In FIG. 7, a number of sample points N are shown with respect to a burst-fired current 126. The burst-fired current has a first burst-fired current cycle starting at C1 (during which J=1), and 17 samples X{0, 1, ... 16} are taken during this sample. Of course, this low sample rate is for the purpose of illustration, where the actual sample rate will be at least an order of magnitude greater than the frequency of the burst-fired current 16. For example, for 60 Hz currents, the sample rates are preferably at least in the kilohertz range. In this example, the AC current-on period is shown at t1 and the current-off period is shown as t2. A second burst-fired current cycle C2 (during which J=2) results in a resetting of the variable N.

Example 2

Figure 10:
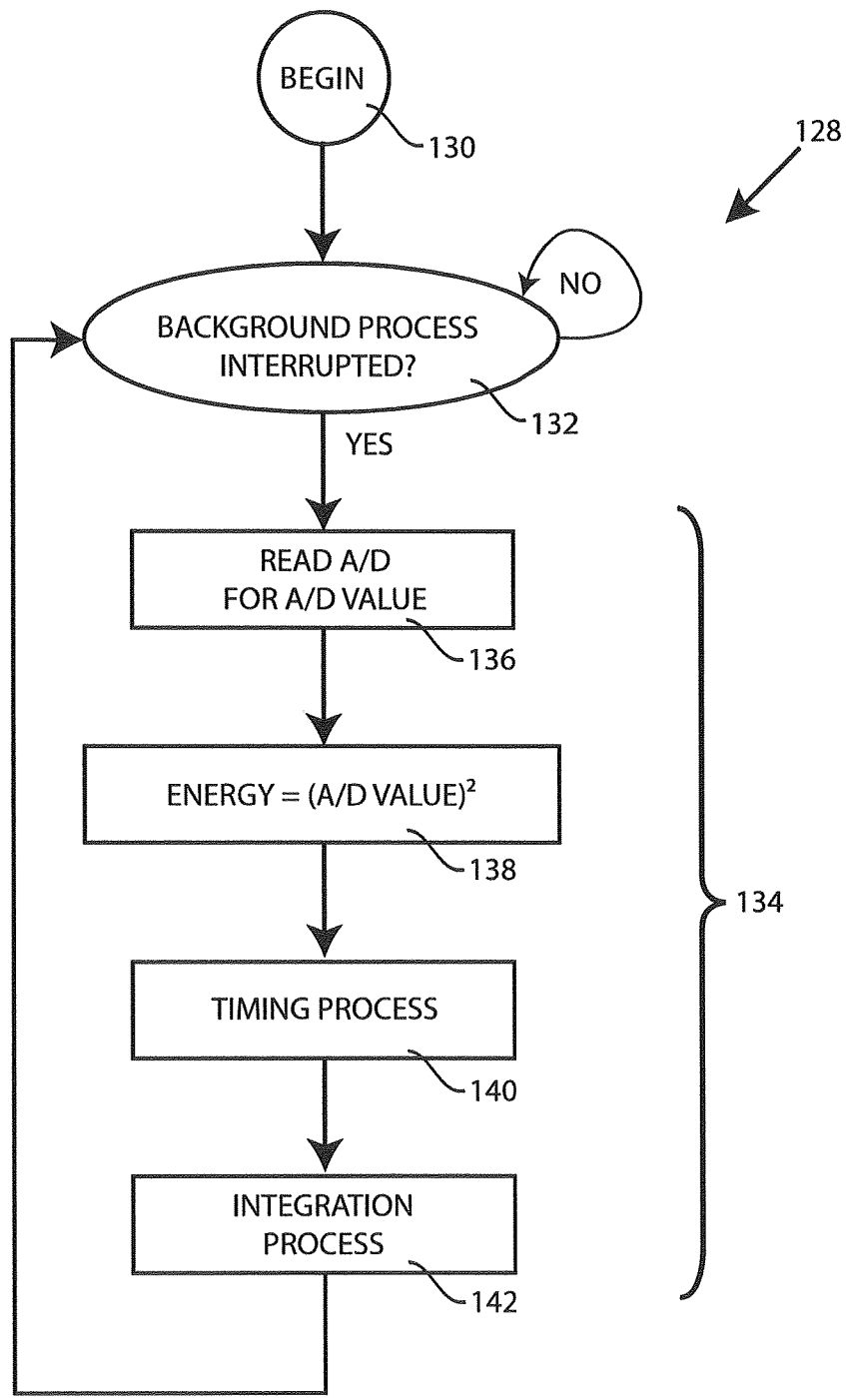
FIG. 10 is a flow diagram of a second example method for measuring RMS values of burst-fired currents.

FIG. 10 illustrates, a second non-limiting example method 128 for measuring RMS values of burst-fired currents. This method can be implemented by the aforementioned code segments stored in digital memory coupled to the processor 46 of FIG. 5. Alternatively, the method can be implemented in other manners, e.g. by a state machine or by discrete logic.

The method 128 begins at 130 with the start of a Background Process 132. In this non-limiting example, the Background Process 132 operates continuously until interrupted by signals or "triggers" generated at regular intervals by, for example, the processor 46 internal clock. Should an interrupt trigger occur, Background Process 132 is suspended and an Interrupt Service Routine (ISR) or "Foreground Process" 134 is initiated. Once the Foreground Process 134 is completed, process control is returned to the Background Process 132 and the suspension of the Background Process is removed. The operation of the Background Process 132 will be discussed in greater detail with reference to FIG. 15.

It will be appreciated that the Background Process 132 will continue until interrupted, at which time it will be suspended. By "suspended" it is meant that the state of the Background Process (including all necessary variables, parameters and states) will be maintained even though the process 132 will cease to execute. After the completion (or "service") of the Foreground Process 134, the Background Process 132 will again start to execute from the point where it was suspended.

As will be appreciated from the following descriptions, much of the "work" of method 128 is performed by the Foreground Process 134. The Foreground Process 134 includes reading the A/D value from, for example, A/D converter 30 of FIG. 4, in an operation 136. The variable Energy is calculated in operation 138 as the square of the A/D value determined in the previous operation. Next, in an operation 140, a Timing Process is initiated. The operation 140 of the Timing Process will be discussed in greater detail with reference to FIGS. 11-13. Then, in an operation 142, an Integration Process is initiated. The operation 142 of the Integration process will be discussed in greater detail with respect to FIG. 14.

Figure 11:
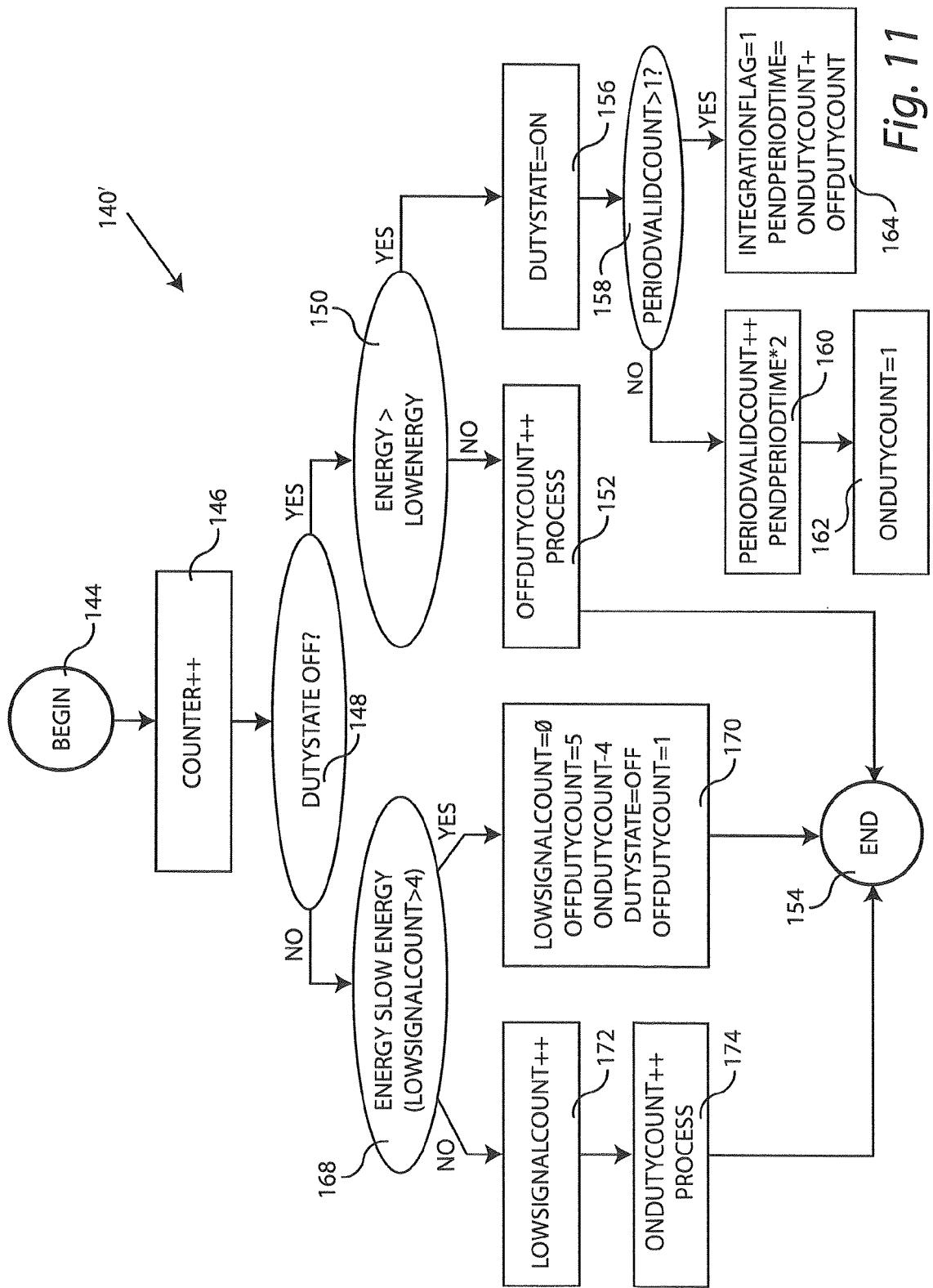
FIG. 11 is a flow diagram of an example timing process of FIG. 10.

In FIG. 11, an operation 140', set forth by way of example but not limitation, of a Timing Process operation 140 of FIG. 10 is illustrated. The Timing Process begins at 144 and, in an operation 146, a variable "Counter" is incremented by 1 (as indicated by "Counter++"). Next, in an operation 148, it is determined whether the DutyState is ON or OFF. If the duty state is OFF, that is an indication that the signal level from, for example, the signal conditioner 28 of FIG. 4, is zero or near zero. If the duty state is ON, that is an indication that the signal level at, for example, signal conditioner 28 of FIG. 4 is non-zero.

In this example, if the DutyState is OFF (e.g. there is no signal), an operation 150 determines whether the variable Energy is greater than LowEnergy (which can be, for example, a predetermined constant). If not, an OffDutyCount++ Process is initiated in an operation 152. The OffDutyCount++ Process will be described in greater detail with reference to FIG. 13. After operation 152 is completed, the Timing Process ends at 154.

If operation 150 determines that Energy>LowEnergy, an operation 156 sets DutyState to ON. Next, in a decision operation 158, it is determined whether PeriodValidCount>1. If not, a period has not been verified and an operation 160 increments PeriodValidCount by 1 (as indicated by PeriodValidCount++) and multiplies PendPeriodTime by 2. Next, in an operation 162, OnDutyCount is set to 1 and the process is completed at 154. If, in operation 158, it is determined that PeriodValidCount is greater than one (e.g. a period has been verified), an operation 164 sets IntegrationFlag=1 and calculates PendPeriodTime as the sum of OnDutyCount and OffDutyCount. Next, operation 162 (described above) is performed and the process is completed at 154.

If, in operation 148, it is determined that the DutyState in ON (e.g. there is a signal), a decision operation 168 determines if Energy<LowEnergy. By way of non-limiting example, this can be determined when LowSignalCount>4, where it is arbitrarily decided that an ON/OFF transition must be verified for over at least 5 interrupts. In other embodiments, other parameters may be used. In this example, if LowSignalCount is greater than 4, then an operation 170 sets LowSignalCount to zero, Off_Duty_Count to 5, On_Duty_Count to −4, DutyState to OFF, and OffDutyCount to 1 and the process is completed at 154. If decision operation 168 determines that Energy>LowEnergy (e.g. that LowSignalCount≤4), an operation 172 increments LowSignalCount (as indicated by LowSignalCount++). The combination of operations 168 and 172 signifies that there are four consecutive low signal counts to qualify a true "low signal" condition, in this non-limiting example. Next, in an operation 174, an OnDutyCount++ Process is initiated. OnDutyCount++ will be discussed in greater detail with respect to FIG. 12. The process is then complete at 154.

Figure 12:
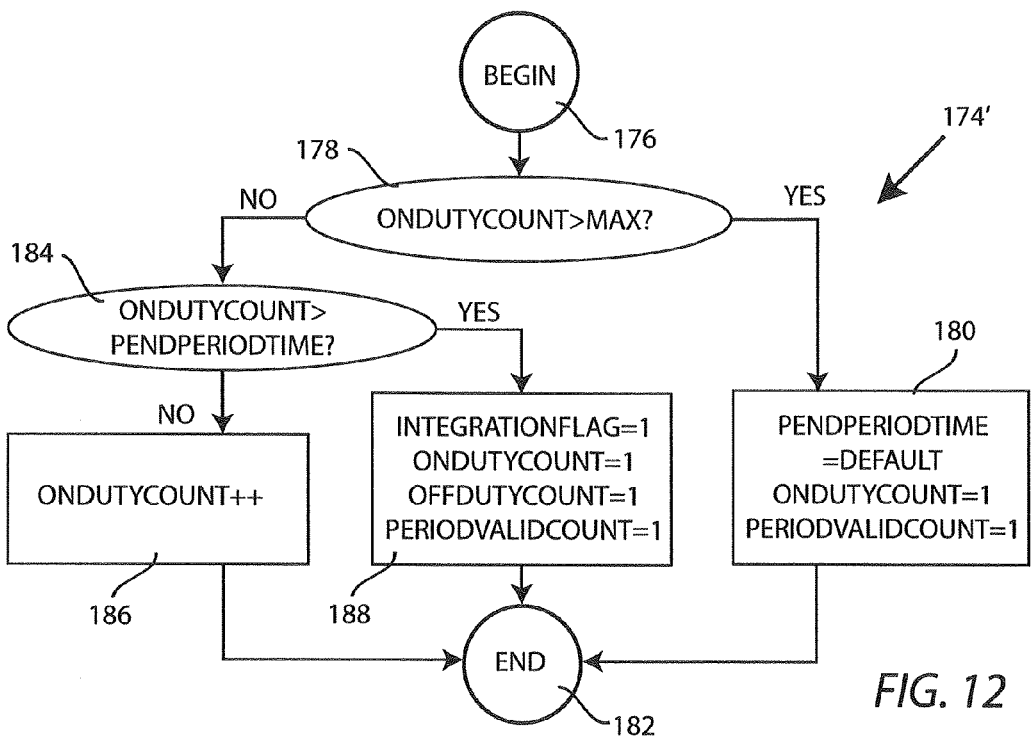
FIG. 12 is a flow diagram of an example OnDutyCount++ process of FIG. 11.

In FIG. 12, an operation 174', set forth by way of example but not limitation, of an OnDutyCount++ Process of FIG. 11 is illustrated. The OnDutyCount++ Process begins at 176 and, in an operation 178, it is determined whether OnDutyCount>MAX (which, again, can be a predetermined constant in some examples). If so, an operation 180 sets PendPeriodTime to DEFAULT, OnDutyCount to 1, and PeriodValidCount to 1. The process is then complete at 182. If, however, operation 178 determines that OnDutyCount<MAX, an operation 184 determines if OnDutyCount>PendPeriodTime. If not, operation 186 increments OnDutyCount (as indicated by OnDutyCount++). If so, operation 188 sets IntegrationFlag, OnDutyCount, OffDutyCount and PeriodValidCount to 1. After performing either of operations 186 or 188 the process is completed at 182.

Figure 13:
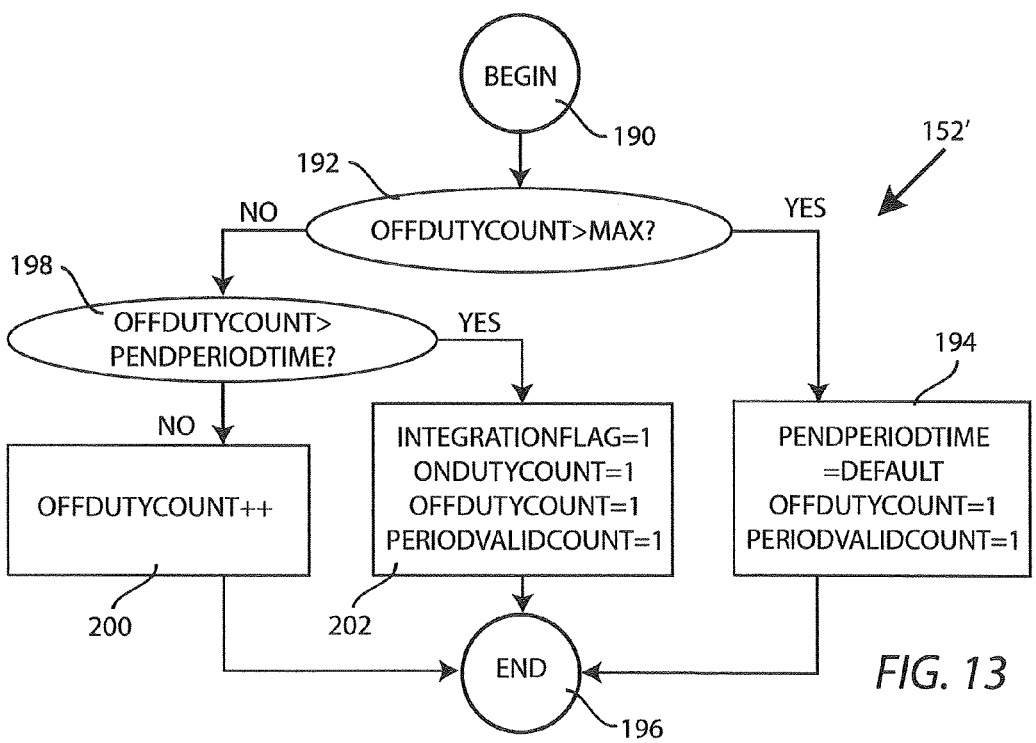
FIG. 13 is a flow diagram of an example OffDutyCount++ process of FIG. 11.

In FIG. 13, an operation 152', set forth by way of example but not limitation, of an OffDutyCount++ Process of FIG. 11 is illustrated. The OffDutyCount++ Process begins at 190 and, in an operation 192, it is determined whether OffDutyCount>MAX. If so, an operation 194 sets PendPeriodTime to DEFAULT, OffDutyCount to 1, and PeriodValidCount to 1. The process is then complete at 196. If, however, operation 192 determines that OffDutyCount≤MAX, an operation 198 determines if OffDutyCount>PendPeriodTime. If not, operation 200 increments OffDutyCount (as indicated by OffDutyCount++). If so, operation 202 sets IntegrationFlag, OnDutyCount, OffDutyCount and PeriodValidCount to 1. After performing either of operations 200 or 202 the process is completed at 196.

Figure 14:
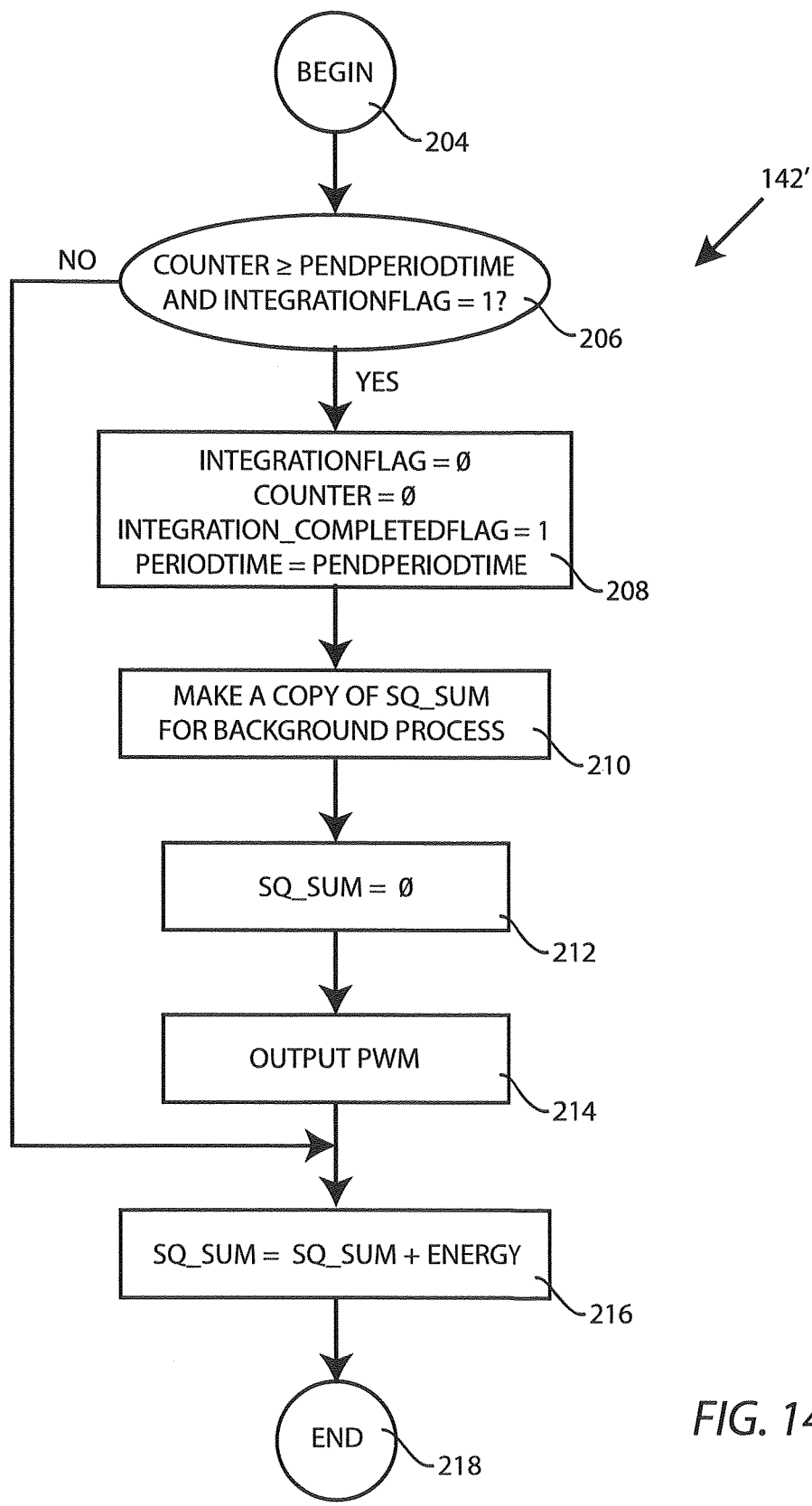
FIG. 14 is a flow diagram of an example integration process of FIG. 10.

In FIG. 14, an operation 142', set forth by way of example but not limitation, of an Integration Process of FIG. 10 is illustrated. The Integration Process begins at 204 and, in a decision step 206, it is determined whether both Counter>PendPeriodTime and IntegrationFlag=1. If so, an operation 208 sets IntegrationFlag and Counter to 0, Integration_Completed_Flag to 1, and PeriodTime to PendPeriodTime as controls for the Background Process (e.g. Integration_Completed_Flag=1 allows the Background Process to start its calculations using PeriodTime). Next, in an operation 210, a copy of Sq_Sum (e.g. Copy<=Sq_Sum) is made for Background Process 132 and, in an operation 212, Sq_Sum is set to 0. PWM is output in an operation 214 to provide a D/A conversion, In an operation 216, Sq_Sum is increased by Energy, and the process is completed at 218. If in decision step 206 is was determined that either Counter≤PendPeriodTime or IntegrationFlag≠1, or both, then process control is transferred directly to operation 216 before the process is completed at 218.

Figure 15:
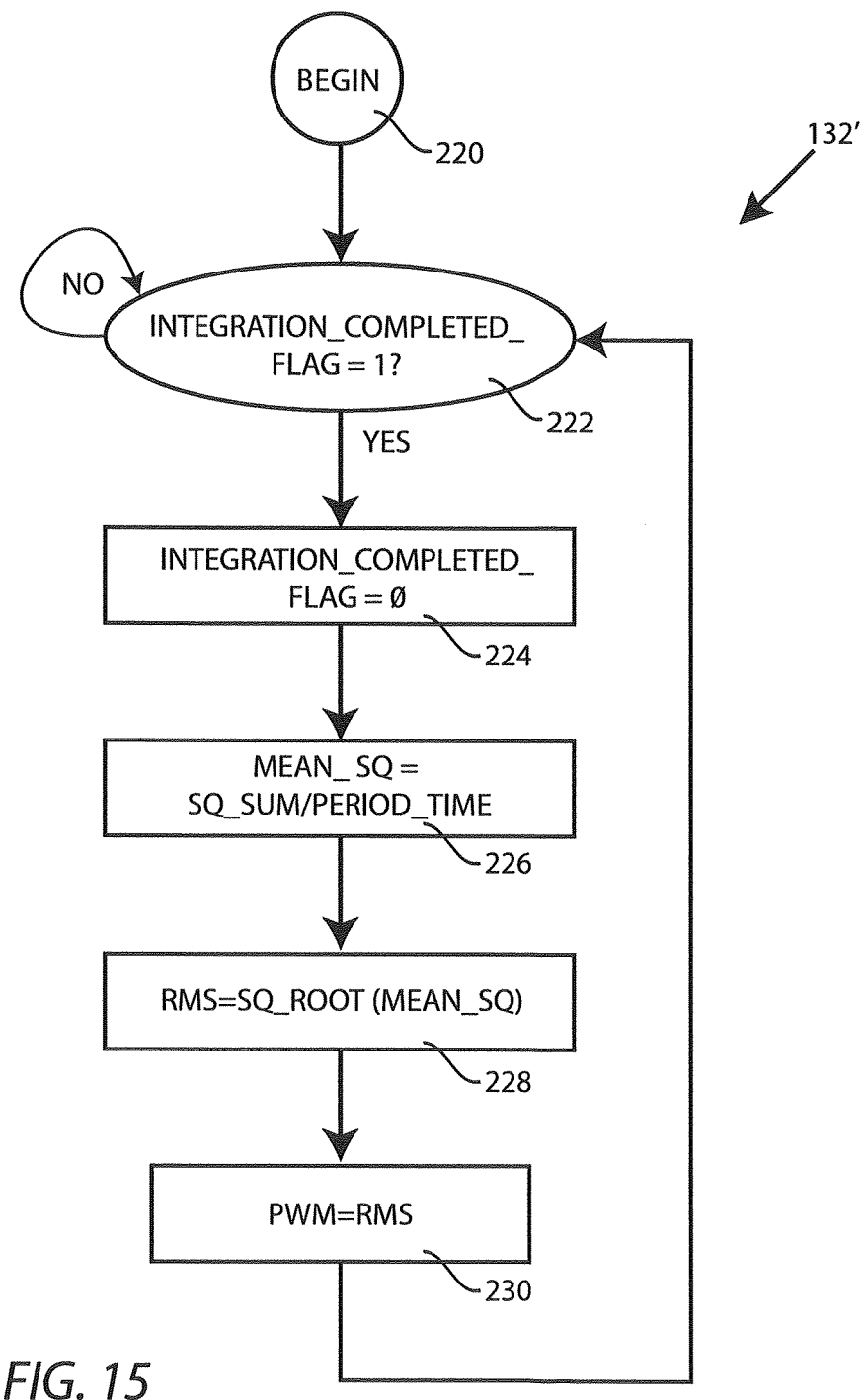
FIG. 15 is a flow diagram of an example Background Process of FIG. 10.

In FIG. 15, an operation 132', set forth by way of example but not limitation, of a Background Process of FIG. 10 is illustrated. The Background Process begins at 220 and, in an decision step 222, it is determined if the Integration_Completed_Flag=1. If so, operation 224 sets Integration_Completed_Flag to 0 and an operation 226 calculates Mean_Sq Sq_Sum/Period_Time. An operation 228 calculates RMS as the square root of Mean_Sq, and PWM is set as RMS in an operation 230 before operational control returns to operation 222.

It will therefore be appreciated that, in this example, the Background Process is essentially in an idle state until the Foreground Process indicates that the integration is complete (e.g. Integration_Completed_Flag=1). By way of non-limiting examples, the interrupt signals may occur every 1.2 milliseconds and the integration may be complete after 100 interrupts (e.g. about every 0.12 seconds). After the integration is completed, the Background Process completes the RMS calculation and uses that as a PWM output for D/A purposes.

Example 3

It will therefore be appreciated that a process for measuring RMS values of a burst-fired currents, set forth by way of example and not limitation, includes: a) initially sampling a burst-fired current signal; b) determining from the initial sampling a burst-fired current pattern; c) sampling the burst-fired current signals N times within a burst-fired current pattern to provide N samples, wherein the burst-fired current pattern includes an alternating current (AC) current-on period and an AC current-off period; and d) calculating an RMS value from the N samples.

In this third example embodiment, the N samples are N voltage level samples includes $\{v_1, v_2, \ldots v_N\}$ and the RMS value is an RMS voltage value $V_{RMS}$ is calculated as:

$$V_{RMS} = \sqrt{(v_1^2 + v_2^2 + \ldots + v_N^2)/N^1}$$

One or more calculated $V_{RMS}$ can be stored in digital memory, and an average $V_{RMS}$ value can be determined from a plurality of the stored $V_{RMS}$ values.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. An apparatus for measuring RMS parameters of devices controlled by burst-fired currents comprising:
   a current sensor to sense burst-fired current having a signal output;
   an analog-to-digital (A/D) converter coupled to said signal output of said current sensor;

a digital processor coupled to an output of said A/D converter; and digital memory coupled to said digital processor including code segments executable on said digital processor for:
   a) sampling said output of said A/D converter;
   b) detecting from said sampling a burst-fired current pattern, wherein said burst-fired current pattern is detected by determining a plurality of samples within alternating current (AC) current-off periods of said burst-fired current pattern followed by a sample within AC current-on periods of said burst-fired current pattern;
   c) in response to detecting said sample within an AC current-on period of said burst-fired current pattern, sampling said output of said A/D converter N times within said burst-fired current pattern to acquire N samples; and
   d) calculating an RMS parameter value from said acquired N samples.

2. An apparatus for measuring RMS parameters of devices controlled by burst-fired currents as recited in claim 1 further comprising a digital-to-analog (D/A) converter having an input coupled to said digital processor.

3. An apparatus for measuring RMS parameters of devices controlled by burst-fired currents as recited in claim 2 further comprising an amplifier having an input coupled to an output of said D/A converter.

4. An apparatus for measuring RMS parameters of devices controlled by burst-fired currents as recited in claim 3 wherein an output of said amplifier is compliant with a 4-20 mA standard.

5. An apparatus for measuring RMS parameters of devices controlled by burst-fired currents as recited in claim 1 further comprising a signal conditioner coupling said current sensor to said A/D converter.

6. An apparatus for measuring RMS parameters of devices controlled by burst-fired currents as recited in claim 1 wherein said current sensor is an inductive current sensor.

7. An apparatus for measuring RMS parameters of devices controlled by burst-fired currents as recited in claim 1 wherein said burst-fired current pattern comprises a burst-fired current cycle.

8. An apparatus for measuring RMS parameters of devices controlled by burst-fired currents as recited in claim 7 wherein said burst-fired current pattern comprises a plurality of burst-fired current cycles.

9. An apparatus for measuring RMS parameters of devices controlled by burst-fired currents as recited in claim 1 wherein said AC current-on periods comprise at least one AC cycle.

10. An apparatus for measuring RMS parameters of devices controlled by burst-fired currents as recited in claim 4 wherein said AC current-off periods comprise a no-current period.

11. An apparatus for measuring RMS parameters of devices controlled by burst-fired currents as recited in claim 1 wherein the acquired N samples are N voltage level samples comprising $\{v_1, v_2, \ldots v_N\}$ and wherein the RMS parameter value is an RMS voltage value $V_{RMS}$ and is calculated as:

$$V_{RMS} = \sqrt{(v_1^2 + v_2^2 + \ldots + v_N^2)/N}.$$

12. An apparatus for measuring RMS parameters of devices controlled by burst-fired currents as recited in claim 11 further comprising storing $V_{RMS}$ in digital memory.

13. An apparatus for measuring RMS parameters of devices controlled by burst-fired currents as recited in claim 12 further comprising calculating and storing multiple $V_{RMS}$ values in digital memory.

14. An apparatus for measuring RMS parameters of devices controlled by burst-fired currents as recited in claim 13 further comprising developing an average $V_{RMS}$ value from a plurality of said stored $V_{RMS}$ values.

15. A method for measuring RMS parameters of devices controlled by burst-fired currents comprising:
   a) sampling a burst-fired current signal;
   b) detecting from said sampling a burst-fired current pattern, wherein said burst-fired current pattern is detected by determining a plurality of samples within alternating current (AC) current-off periods of said burst-fired current signal followed by a sample within AC current-on periods of said burst-fired current signal;
   c) in response to detecting said sample within an AC current-on period of said burst-fired current pattern, sampling said burst-fired current signal N times within said burst-fired current pattern to acquire N samples; and
   d) calculating an RMS parameter value from said acquired N samples.

16. A method for measuring RMS parameters of devices controlled by burst-fired currents as recited in claim 15 wherein the acquired N samples are N voltage level samples comprising $\{v_1, v_2, \ldots v_N\}$ and wherein the RMS parameter value is an RMS voltage value $V_{RMS}$ and is calculated as:

$$V_{RMS} = \sqrt{(v_1^2 + v_2^2 + \ldots + v_N^2)/N}.$$

17. A method for measuring RMS parameters of devices controlled by burst-fired currents as recited in claim 16 further comprising storing $V_{RMS}$ in digital memory.

18. A method for measuring RMS parameters of devices controlled by burst-fired currents as recited in claim 17 further comprising calculating and storing multiple $V_{RMS}$ values in digital memory.

19. A method for measuring RMS parameters of devices controlled by burst-fired currents as recited in claim 18 further comprising developing an average $V_{RMS}$ value from a plurality of said stored $V_{RMS}$ values.

* * * * *